United States Patent [19]
Weiss et al.

[11] Patent Number: 5,559,328
[45] Date of Patent: Sep. 24, 1996

[54] SMALL CAVITY ANALYTICAL INSTRUMENTS

[75] Inventors: Paul S. Weiss; Lloyd A. Bumm, both of State College, Pa.; Barry G. Willis, Los Altos Hills; Richard L. Baer, Los Altos, both of Calif.

[73] Assignee: Biotechnology Research and Development Corporation, Peoria, Ill.

[21] Appl. No.: 283,007

[22] Filed: Jul. 29, 1994

Related U.S. Application Data

[63] Continuation-in-part of Ser. No. 120,560, filed as PCT/US93/06718, Jul. 16, 1993.

[51] Int. Cl.$^6$ .................................................. H01J 37/20
[52] U.S. Cl. ..................... 250/306; 250/440.11; 324/636
[58] Field of Search ................................... 250/306, 307, 250/440.11, 442.11; 324/636

[56] References Cited

U.S. PATENT DOCUMENTS

| | | |
|---|---|---|
| 3,566,262 | 2/1971 | Thompson et al. . |
| 4,941,753 | 7/1990 | Wickramasinghe . |
| 5,060,248 | 10/1991 | Dumoulin . |
| 5,268,573 | 12/1993 | Weiss et al. . |
| 5,281,814 | 1/1994 | Weiss et al. ............................ 250/306 |

OTHER PUBLICATIONS

"Scanning Tunneling Microscope Instrumentation," Kuk et al., Rev. Sci. Instrum. 60(2):165–180, Feb. 1989.

"Fields and Waves in Communication Electronics," Ramo et al., Second Edition, Section 10.2, pp. 486–522.

"A Tunable Microwave Frequency Alternating Current Scanning Tunneling Microscope," by Stranick et al., Review of Scientific Instruments, vol. 65, No. 4, Part 1, Apr. 1994.

"Alternating Current Scanning Tunneling Microscopy and Nonlinear Spectroscopy," Stranick et al., Journal of Physical Chemistry, vol. 98, No. 7, pp. 1762–1764.

"Analytical Applications of Scanning Tunneling Microscopy," Weiss, reprinted from TRAC—Trends in Analytical Chemistry, Elsevier, pp. 61–67.

"Carrier Excitation by Atomic Collisions at Semiconductor Surfaces," Weiss et al., Physical Review B, vol. 38(14):9928–9935, Nov. 15, 1988.

"Alternating Current Scanning Tunneling Spectroscopy of Self–Assembled Monolayers on Gold," Stranick et al., Journal of Vacuum Science & Technology A, Second Series, vol. 11, No. 4, Part 1, Jul./Aug. 1993.

"Scanning Force microscopy (SFM)," Meyer et al., Analytical Corner, Springer Series in Surfaces Sciences.

Advertisement entitled "Conductive Silicone Elastomers," 2 pages.

"Nanosources and Manipulation of Atoms Under High Fields and Temperatures: Applications," edited by Binh et al., NATO ASI Series, Series E: Applied Sciences, vol. 235, pp. 19–33.

"Generation of Microwave Radiation in the Tunneling Junction of a Scanning Tunneling Microscope," by Krieger et al., The American Physical Society, vol. 41, No. 14, May 15, 1990, pp. 10229–10232.

"A New Impedance Spectrometer for the Investigation of Electrochemical Systems," by Popkirov et al., Rev. Sci. Instrum., vol. 63, No. 11, pp. 5366–5372.

(List continued on next page.)

*Primary Examiner*—Jack I. Berman
*Attorney, Agent, or Firm*—Majestic, Parsons, Siebert & Hsue

[57] ABSTRACT

A sample and the tip portion of an alternating current scanning tunneling microscope are electrically enclosed within a cavity with electrically conductive walls. The dimensions of the cavity are smaller than the wavelength of a component of the AC signal applied by the probe to the sample so that the output signal detected by the probe from the sample will not be contaminated by resonant effects of the cavity.

17 Claims, 6 Drawing Sheets

OTHER PUBLICATIONS

"Scanning Tunneling Microscopy, Resonant Tunneling, and Counting Electrons: A Quantum Standard of Current," by Guinea et al., Physical Review Letters, vol. 65, No. 3, pp. 281–284, Jul. 16, 1990.

"AC Scanning Tunneling Microscopy and Spectroscopy," by Stranick et al., Version Date Aug. 28, 1992.

"Near–Field Optics: Microscopy, Spectroscopy, and Surface Modification Beyond . . . ," Betzig et al., *Science*, V. 25, pp. 189–195, Jul. 10, 1992.

"Breaking the Diffraction Barrier: Optical Microscopy on a Nanometric Scale," Betzig et al., *Science*, V. 251, pp. 1468–1470, Mar. 22, 1991.

"Super–Resolution Aperture Scanning Microscope," Weiss, *Nature*, V. 237, pp. 510–512, Jun. 10, 1972.

"Scanning Surface Harmonic Microscopy: Scanning Probe Microscopy . . . ," Michel et al., *Rev. Sci. Instrum.*, V. 63, No. 9, pp. 4080–4085, Sep. 1992.

"Nonlinear Alternating–Current Tunneling Microscopy," Kochanski, *Physical Review Letters*, 62(19):2285–2288 (May 8, 1989).

"Nonlinear Alternating–Current Tunneling Microscopy (AT&T Preprint (Aug. 17, 1988))", published in *Phys. Rev. Ltrs*, 62(19):2285–2288 (May 8, 1989).

"Scanning Tunneling Microscopy at Microwave Frequencies," *Ultramicroscopy*, Seifert et al., pp. 42–44; 379–387 (1992).

"Scanning Tunneling Microscopy at Microwave Frequencies," *Ultramicroscopy*, (Preprint, Korrigierte Version, Nov. 6, 1991), pp. 42–44; 379–387 (1992).

"Scanning Tunneling Microscopy I," Anselmetti et al., pp. 5–6.

"Laser–Frequency Mixing Using the Scanning Tunneling Microscope," Arnold et al *J. Vac. Sci. Technol.*, A, 6(2):466–469 (Mar./Apr. 1988).

"Laser–Frequency Mixing in the Junction of a Scanning Tunneling Microscope," *Appl. Phys. Lett.*, 51(11)786–788 (Sep. 14, 1987), Arnold et al.

"Laser–Driven Scanning Tunneling Microscope," Volcker et al., *Phys. Rev. Lett.*, 66(13)1717–1720 (Apr. 1, 1991).

"Scanning Tunneling Microscopy of Photoexcited Carriers at the Si(001) Surface," Cahill et al., *J. Vac. Sci. Techn.*, B, 9(2):564–567 (Mar./Apr. 1991).

"Atomically Resolved Carrier Recombination at Si(111)–(7×7) Surfaces," Hamers et al., *Phys. Rev. Lett.*, 64(9):1051–1054 (Feb. 26, 1990).

"Optical Interactions in the Junction of a Scanning Tunneling Microscope," Kuk et al., *Phys. Rev. Lett.*, 65(4):456–459 (1990).

"Correlated Discrete Transfer of Single Electrons in Ultrasmall Tunnel Junctions," Likharev, *IBM J. Res. Develop.*, 32(1):144–158 (Jan. 1988).

"Single Electronics," Likharev et al., *Scientific American*, Jun. 1992.

"Ultramicroelectrodes: Cyclic Volammetry Above One Million Vs", *J. Electro anal. Chem.*, 248:447–450 (1988).

"High–Speed Cyclic Voltammetry," Wightman et al., *Acc. Chem. Res.*, 23:64–70 (1990).

"Single Charge Tunneling Coulomb Blockade Phenomena . . . ," Grabert et al., NATO ASI Series, Series B: Physics, vol. 294, pp. 1–19, 1992.

"Time–Correlated Single–Electron Tunneling in One–Dimensional Arrays of Ultrasmall . . . ," Delsing et al., *Phys. Rev. Lett.*, 63(17):1861–1864, Oct. 23, 1989.

G. Meijer et al., *Nature*, 348, 621 (1990).

"A Versatile Microwave–Frequency–Compatible Scanning Tunneling Microscope," Stranick et al., *Rev. Sci. Instrum.*, 64(5):1232–1234, May 1993.

"Coarse Tip Distance Adjustment and Positioner for a Scanning Tunneling Microscope," Frohn et al., *Rev. Sci. Instrum.*, 60(6):1200–1201, Jun. 1989.

"Nanosources and Manipulation of Atoms Under High Fields and Temperatures: Applications," edited by Binh et al., NATO ASI Series, V. 235, pp. 19–33.

Product brochure entitled "The Beetle STM–A Versatile, UHV Compatible Scanning Tunneling Microcope".

"An Easily Operable Scanning Tunneling Microscope," Besocke, *Surface Science*, 181:145–153, 1987.

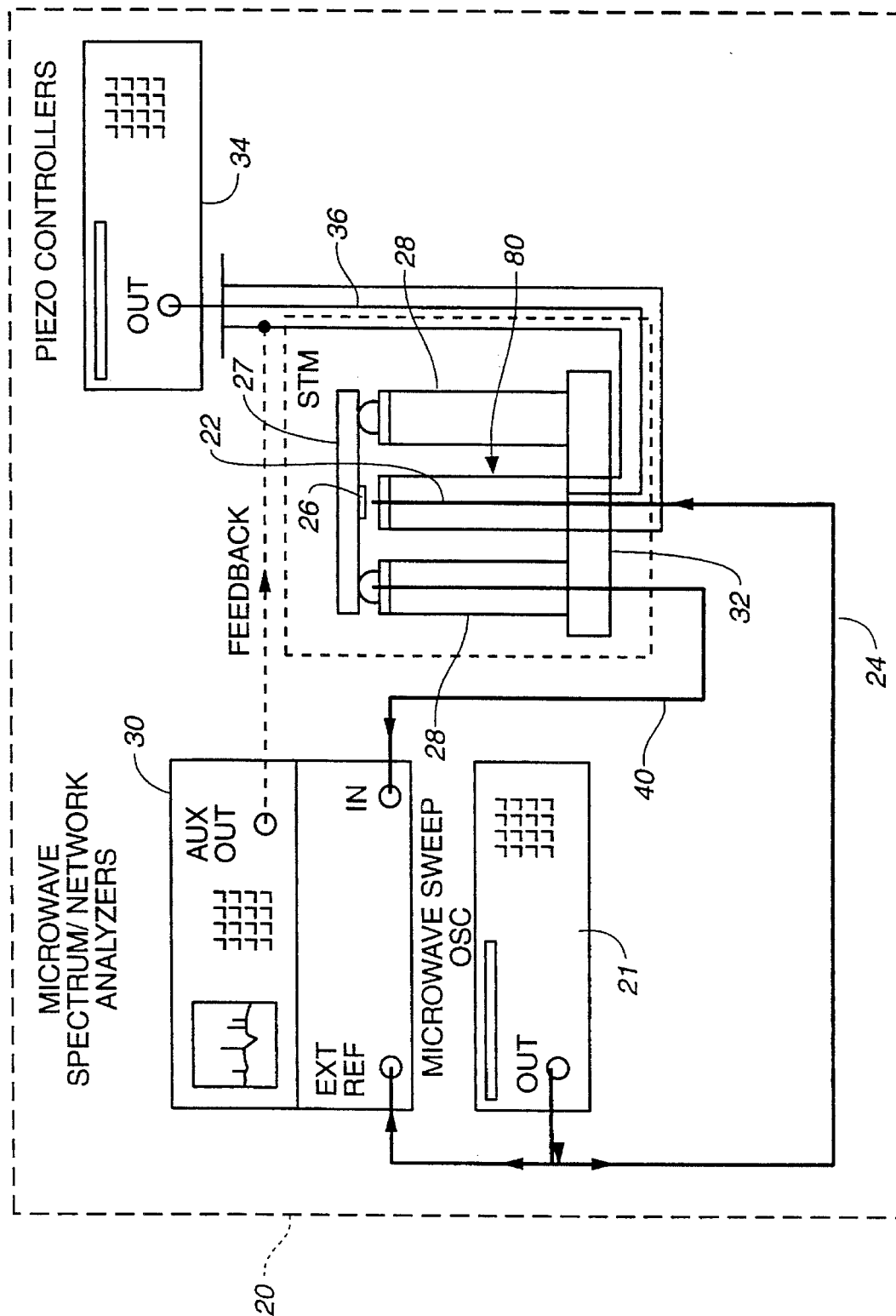
FIG._1

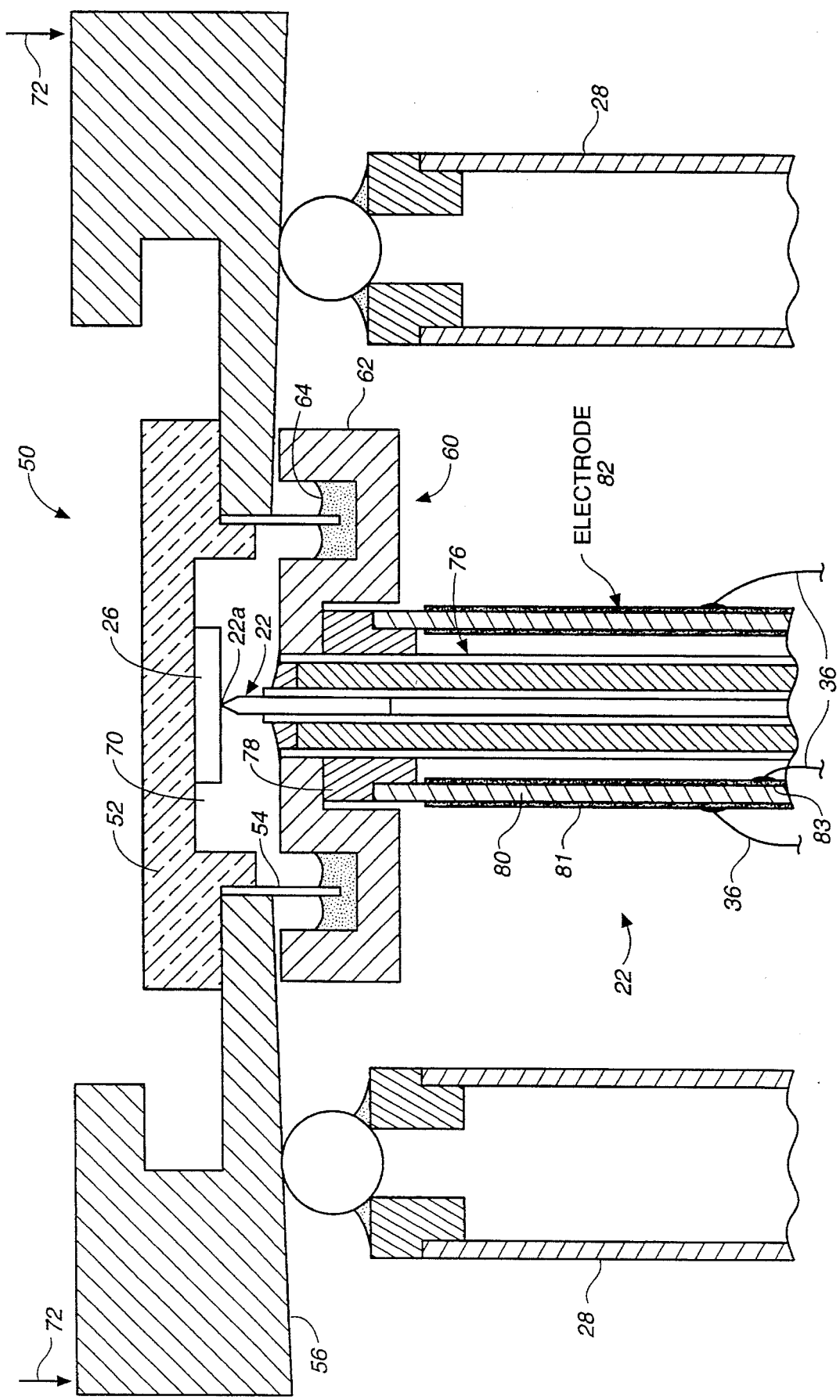
FIG._2

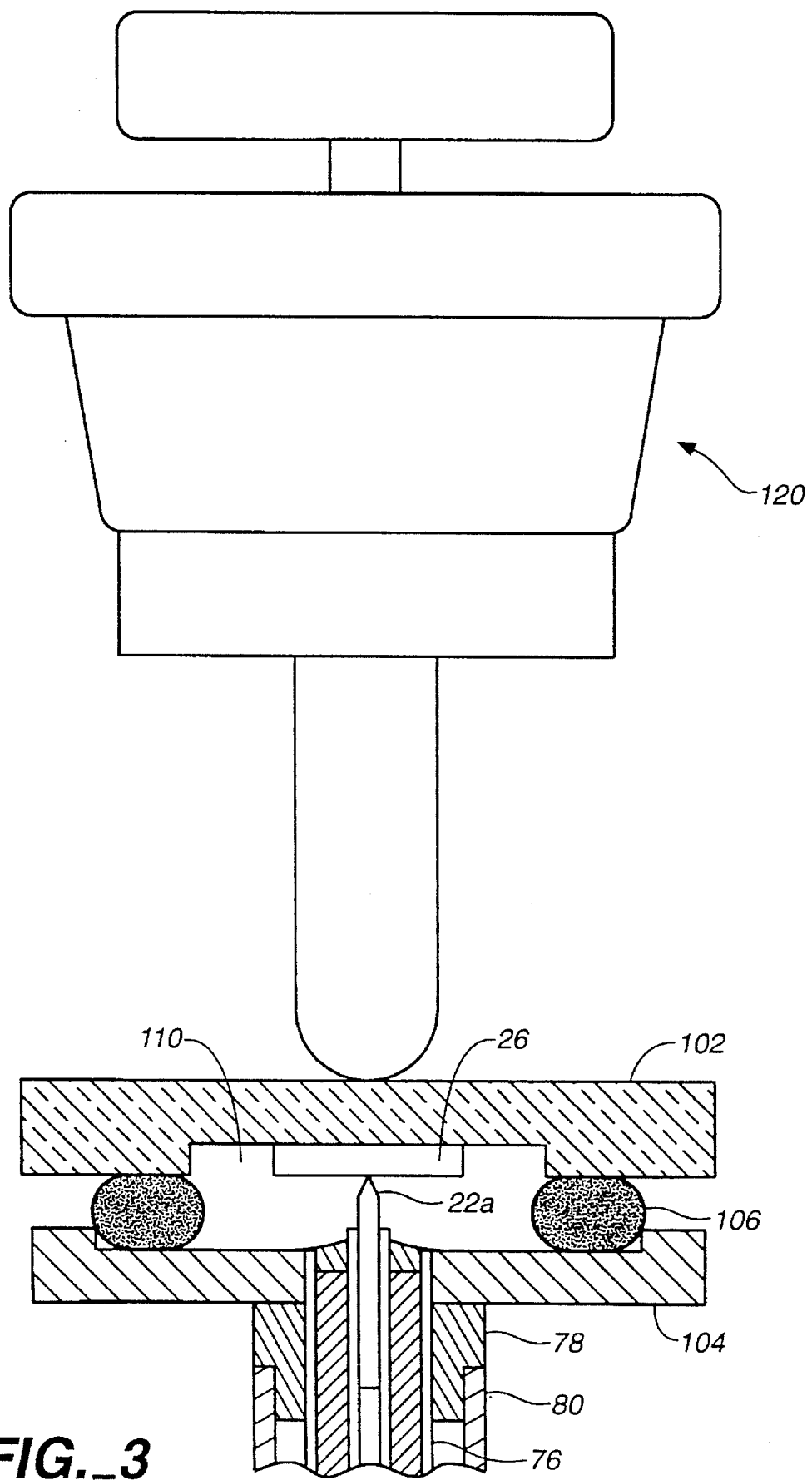
FIG._3

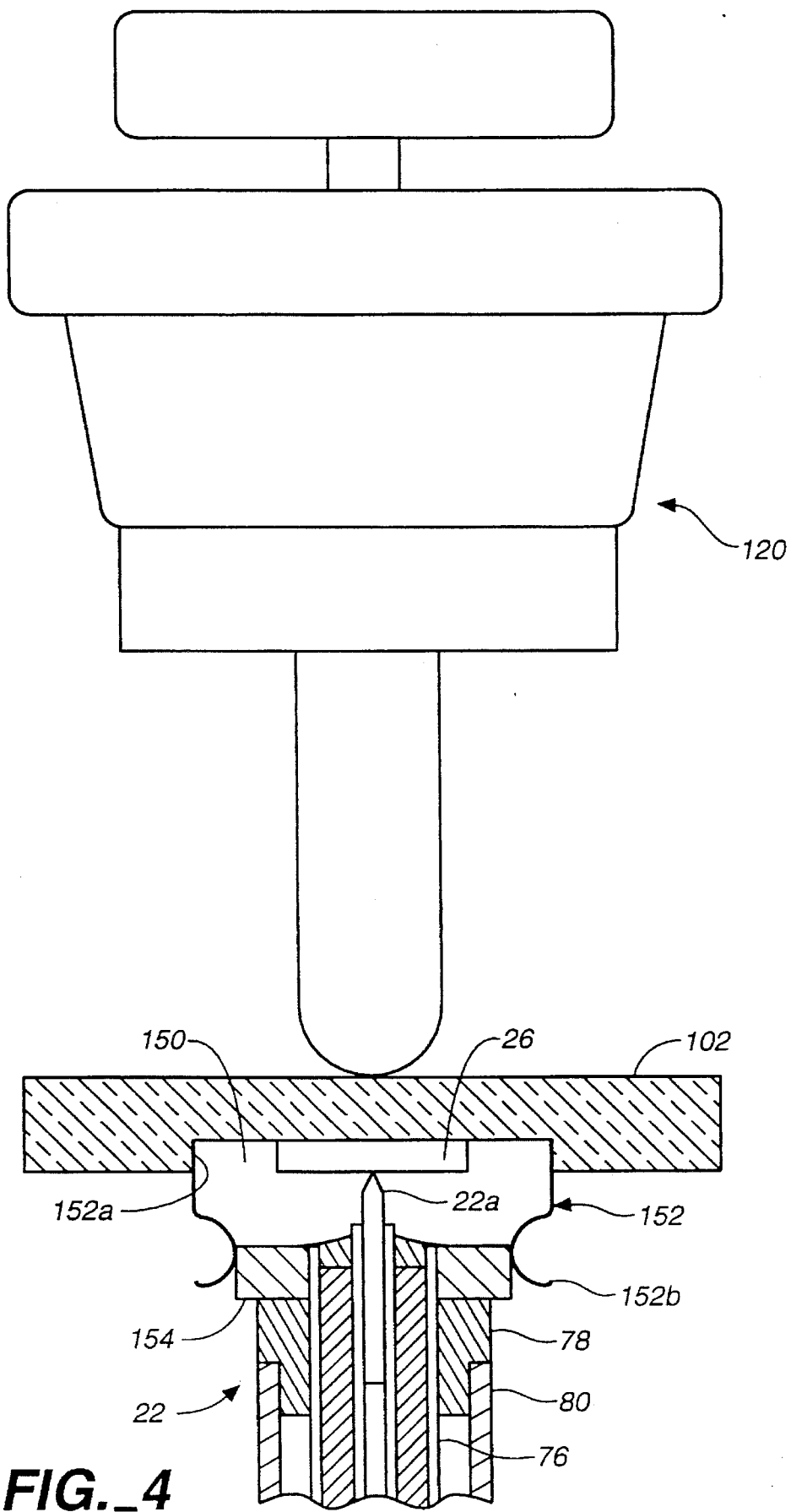
FIG._4

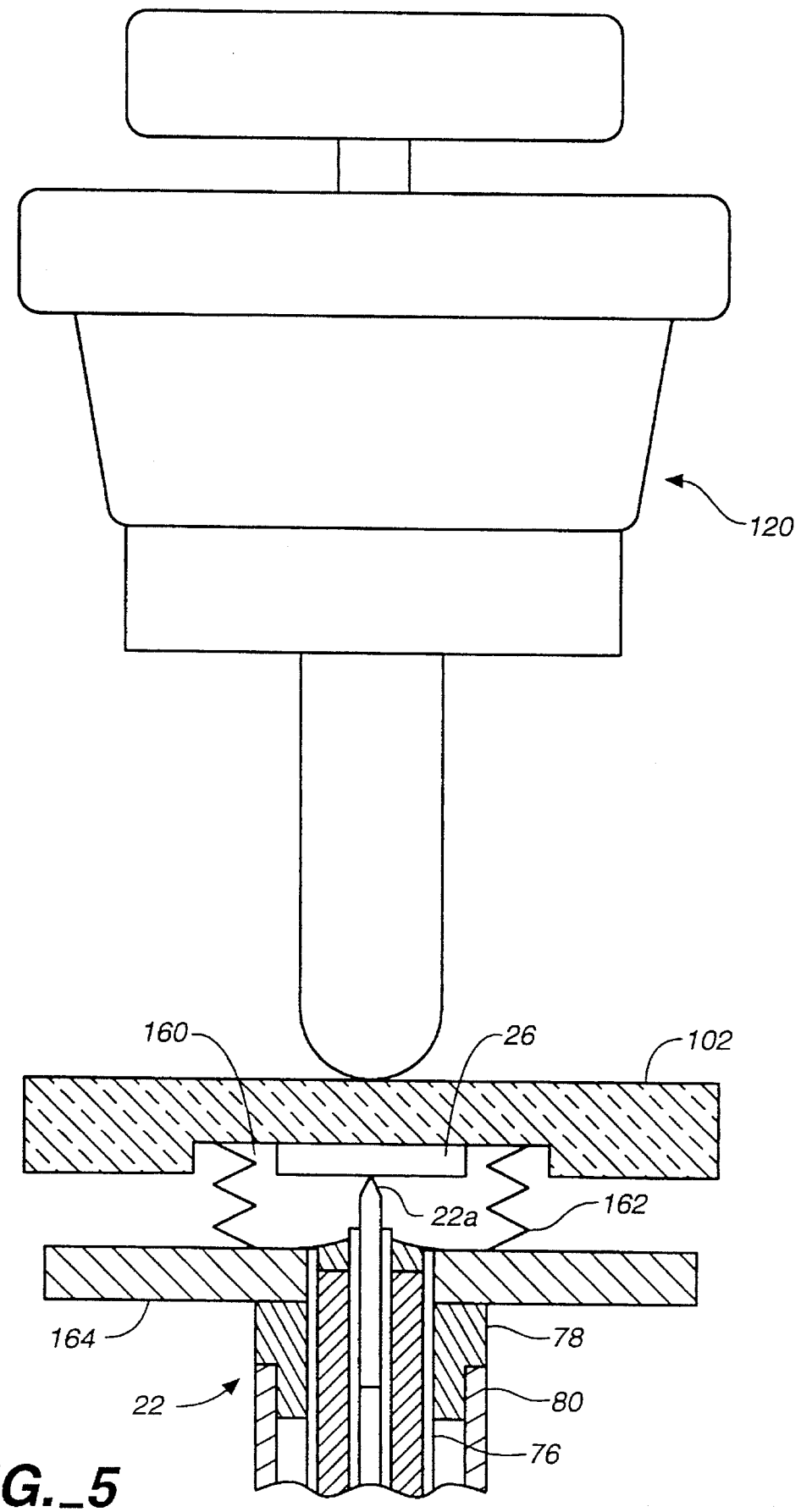
FIG._5

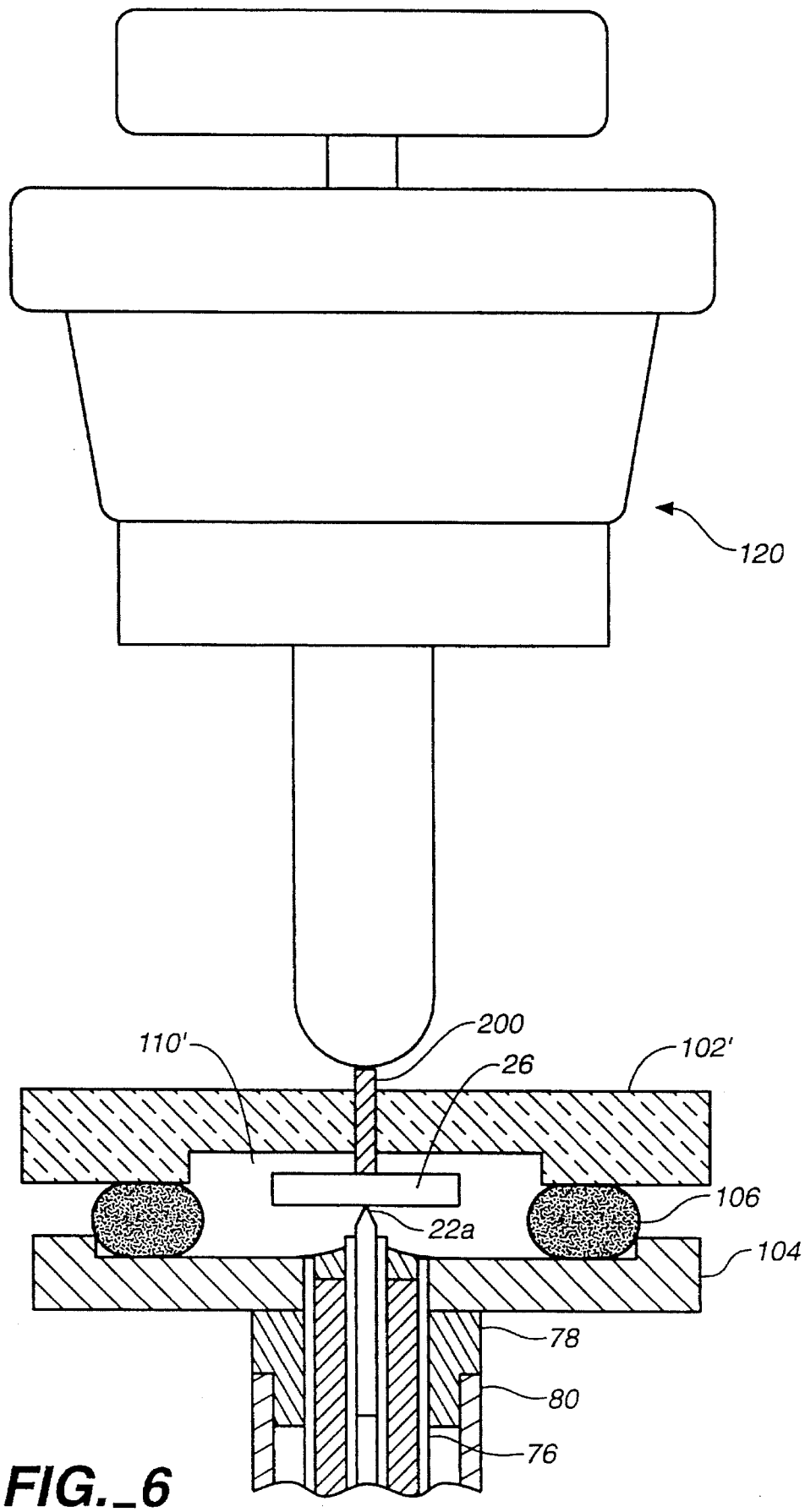
FIG._6

SMALL CAVITY ANALYTICAL INSTRUMENTS

CROSS-REFERENCE TO RELATED APPLICATION

This is a continuation-in-part application of the application entitled "A System for Analyzing Surfaces of Samples," Ser. No. 08/120,560, filed Sept. 13, 1993, and this application claims priority from the PCT Appln No. PCT/US93/06718, filed Jul. 16, 1993 entitled "System for Detecting Threshold Phenomena Associated with and/or Atomic or Molecular Spectra of a Substance," referred to herein as the "parent applications." Both parent applications are incorporated herein by reference in their entireties.

BACKGROUND OF THE INVENTION

This invention relates in general to analytical instruments and, in particular, to instruments employing a small cavity to reduce noise and other artifacts caused by resonances of structural elements of the instruments.

With the advent of instruments such as the scanning tunneling microscope (STM), it is now possible to investigate the structure, spectra and dynamics of biological molecules and membranes as well as other substances at the atomic or molecular level. While more than a thousand STM's have been in operation and the instrument has sparked great interest in spectroscopy, the actual headway that has been made in this area remains rather modest. Thus, Bob Wilson and co-workers at IBM Almaden have made some progress in distinguishing closely related adsorbed surface species in STM images. G. Meijer et al., *Nature* 348, 621 (1990). In "Non-Linear Alternating-Current Tunneling Microscopy," Kochanski, *Physical Review Letters,* 62(19):2285–2288, May 1989, a method for scanning tunneling microscopy is described, where a non-linear alternating current (AC) technique is used that allows stable control of a microscope tip in close proximity to insulating surfaces where direct current (DC) tunneling is not possible.

The STM has a counter electrode on which the sample to be investigated is placed and another electrode in the shape of a microscope probe with a tip placed a small distance from the sample surface. A DC or a low frequency AC signal is then applied across the pair of electrodes. The probe tip is then moved across the sample surface in a scanning operation and the changes in the current or voltage across the electrodes are monitored to detect the characteristics of the sample. Where the probe tip of the STM applies an alternating current (AC) signal to the sample, the STM is referred to as an ACSTM.

A number of specific implementations of the scanning tunneling microscope have been proposed. See, for example, "A Versatile Microwave-Frequency-Compatible Scanning Tunneling Microscope," by Stranick and Weiss, *Rev. Sci. Instrum.,* 64(5):1232–1234, May 1993; "Coarse Tip Distance Adjustment and Positioner for a Scanning Tunneling Microscope," by Frohn et al., *Rev. Sci, Instrum.,* 60(6):1200–1201, June 1989; a product brochure from Besocke Delta Phi GmbH of Juelich, Germany, entitled "The Beetle STM - A Versatile, UHV Compatible Scanning Tunneling Microscope," and "An Easily Operable Scanning Tunneling Microscope," by Besocke, *Surface Science,* 181:145–153, 1987.

In the existing designs of the ACSTM, artifacts are often present in the output signal of the ACSTM, where the artifacts are caused by resonance effects of the structure of the microscope and its surroundings. This is particularly the case where the AC signal provided by the ACSTM is at high frequencies such as at microwave frequencies. The use of microwave frequencies in the ACSTM is taught, for example, in U.S. Pat. No. 5,268,573. It is therefore desirable to provide an improved ACSTM where such resonance effects are reduced to improve the signal-to-noise ratio.

SUMMARY OF THE INVENTION

To avoid the above-described resonance effects, the system of this invention employs a cavity whose dimensions are sufficiently small so that no interfering resonant electromagnetic modes are supported within the cavity at the frequency or frequencies of interest.

One aspect of the invention is directed towards an apparatus for analyzing samples comprising at least one analytical instrument applying or detecting an AC electrical signal from a sample, said signal including a signal component at a frequency. The apparatus further includes a housing enclosing a cavity, including (a) a first electrically conductive portion for holding the sample and (b) a second electrically conductive portion for holding the instrument or a portion thereof. The dimensions of the cavity are small enough so that the frequency of the lowest resonant electromagnetic mode of the cavity and its contents is greater or higher than the frequency of the signal component.

Another aspect of the invention is directed towards a method for analyzing samples, employing a housing enclosing a cavity. The housing includes a first electrically conductive portion holding a sample and a second electrically conductive portion holding an instrument or a portion thereof and an electrically conductive movable structure connecting the two portions. The method comprises the steps of positioning the first conductive portion relative to the second portion so that the sample is aligned to the instrument and causing relative motion between the first and second portions until the instrument is adjacent to the sample so that the structure together with the two portions electrically enclose the sample and the instrument or a portion thereof in said cavity when the instrument or its portion is adjacent to the sample. The method further comprises performing a measurement on the sample using the instrument and maintaining electrical enclosure of the sample and the instrument or a portion thereof by said conductive portions and the structure during the performing step.

BRIEF DESCRIPTION OF THE DRAWINGS

FIG. 1 is a schematic diagram of an ACSTM to illustrate the invention.

FIG. 2 is a cross-sectional view of a sample, an ACSTM, a cavity enclosing the sample and a portion of the ACSTM, and an electrically conductive junction including conductive fluid to illustrate one embodiment of the invention.

FIG. 3 is a cross-sectional view of a sample, an ACSTM, a cavity enclosing the sample and a portion of the ACSTM, and a gasket-type electrically conductive junction to illustrate a second embodiment of the invention. FIG. 3 also illustrates a differential screw or differential spring mechanism for gross adjustments of the distance between the sample and the portion of the ACSTM.

FIG. 4 is a cross-sectional view of a sample, an ACSTM, a cavity enclosing the sample and a portion of the ACSTM, and a leaf-spring-type electrically conductive junction to illustrate a third embodiment of the invention. FIG. 4 also shows a differential screw or differential spring mechanism similar to that of FIG. 3.

FIG. 5 is a cross-sectional view of a sample, an ACSTM, a cavity enclosing the sample and a portion of the ACSTM, and a bellows type electrically conductive junction to illustrate a fourth embodiment of the invention. FIG. 5 also illustrates a differential screw or differential spring type mechanism of FIG. 3.

FIG. 6 is a cross-sectional view of a sample, an ACSTM, a cavity enclosing the sample and a portion of the ACSTM, and a gasket-type electrically conductive junction to illustrate a fifth embodiment of the invention. FIG. 6 also illustrates a differential screw or differential spring mechanism for gross adjustments of the distance between the sample and the portion of the ACSTM where the mechanism is attached to a sample through a rod or screw passing through the cavity wall into the cavity.

For simplicity, identical components in different figures of this application are labeled by the same numerals.

DETAILED DESCRIPTION OF THE PREFERRED EMBODIMENT

FIG. 1 is a schematic diagram of a system 20 including a beetle-style high frequency scanning tunneling microscope for imaging samples using through-put attenuation with a network analyzer, or using non-linear harmonic recording with a spectrum analyzer to illustrate the invention. As shown in FIG. 1, a microwave sweep oscillator 21 generates an AC signal and applies it to microscope probe 22 through line 24. Probe electrode 22 is placed close to but spaced apart (by vacuum, a gas or a fluid) from a sample 26 attached to a counter electrode 27 which is placed on top of and in contact with the piezoelectric tube assembly 28 comprising one or more peripheral tubes and described in more detail in parent application Serial No. 08/120,560. A signal line inside assembly 28 is connected to microwave spectrum/network analyzers 30. The position of the probe electrode 22 over sample 26 is controlled by changing the length of piezoelectric tube 80 by applying a voltage through lines 36 to it as controlled by piezo controllers 34. Controllers 34 receive from analyzers 30 a signal to be used for feedback. Since the tip and sample contacts of a beetle-style STM are rigid and stationary, such a STM is ideal for use with semi-rigid coaxial cables in an ACSTM permitting samples to be changed and brought to the STM.

In operation, the microwave sweep oscillator 21 applies the AC signal to probe electrode 22 and analyzers 30 applies typically a reference voltage such as a virtual ground to the signal line in assembly 28 and counter electrode 27. The current or voltage between electrode 22 and counter electrode 27 through sample 26 is monitored by analyzers 30 which derive a feedback signal for controlling controllers 34. In the constant amplitude mode, this feedback signal is applied to the piezo controllers 34 for moving the probe electrode 22 away from or towards the sample 26 in order to maintain a constant signal amplitude between electrode 22 and sample 26. For a sufficiently conductive sample, the ACSTM can be operated in a constant DC current mode as a conventional STM but with a simultaneous application and/or detection of AC signals. In other words, a constant DC current can be applied, and an AC signal is detected from the sample. In constant height mode, the distance between probe electrode 22 and the counter electrode 27 is maintained at a constant average value and the feedback signal derived from the output of analyzers 30 is either not applied to controllers 34 or attenuated to a very low value before it is applied to controllers 34.

The system 20 of FIG. 1 can be modified by detecting a reflected signal at electrode 22 instead of the transmitted signal at the counter electrode 27. In such event, no connection between analyzer 30 and the signal line in assembly 28 is necessary. The reflected signal is sent back through a coaxial cable 24 to analyzer 30 and can also be used as feedback to control controller 34.

FIG. 2 is a cross-sectional view of a sample 26, an ACSTM, a cavity 70 enclosing the sample and a portion of the ACSTM, and an electrically conductive junction including a conductive fluid to illustrate a first embodiment of the invention. As shown in FIG. 2, sample 26 is attached to an upper housing portion 50 including a sample holder 52, a ring 54, and a beetle walker ramp 56, where all three components of the upper housing portion are electrically conductive. This upper housing portion 50 is supported by piezoelectric tube assemblies 28 as shown in FIG. 2.

An AC signal is applied by tip 22a of the probe to sample 26 for performing measurements of the sample in the manner described above. Tip 22a is part of the probe electrode 22 which is attached to a lower housing portion 60 including an electrically conductive container 62 and a conductive fluid such as liquid metal 64 (eg. mercury or gallium) contained in the container. As shown in FIG. 2, ring 54 is suspended in conductive fluid 64 so as to electrically enclose sample 26 and tip 22a of the ACSTM within cavity 70 when tip 22a is at a desired location for measuring the sample 26 and during the measurement.

In previous designs of the ACSTM, the structural elements and enclosures of the microscopes are of such dimensions that the signals detected by the ACSTM include resonance effects. This may be a problem where the AC signal applied by tip 22a to the sample or generated in the tunneling junction between tip 22a and sample 26 is of high frequencies, such as microwave frequencies. This invention is based on the observation that, by constructing upper and lower housing portions 50 and 60 such that the dimensions of cavity 70 and the structures therein are sufficiently small so that no interfering resonant electromagnetic modes are supported at the frequency or frequencies of interest within the enclosure or by the enclosed structure or structures. In other words, of the many resonant electromagnetic modes of the cavity and the structures therein, the size of the cavity is such that the frequency of the lowest resonant electromagnetic mode of the cavity and the enclosed structures is higher than the frequency of the signal or the signal component supplied to the sample and higher than the frequency of the signal or the signal component detected by the ACSTM. This is referred to below as the small cavity criteria. Therefore, once the enclosed structure or structures are known, one skilled in the art will be able to design and choose the size of the cavity so that the small cavity criteria are met. See for example, *Field and waves in Communication Electronics*, 2nd ed., John Wiley & Sons, Inc., New York, N.Y., 1984, Chapter 10, pp. 486–522.

Dimensions of the cavity required to fulfill the small cavity criteria or conditions are complicated functions of the shape and size of the cavity and of the structures in the cavity and of the electromagnetic properties of the cavity wall and the structures therein, such as permitivity, permeability and conductivity. Typically the dimensions of the cavity are less than one half spatial wavelength corresponding to the highest frequency of interest (that is, of the signal component supplied to the sample or detected from the sample). Structures can be introduced into the cavity to effect or remove particular resonant electromagnetic modes of the cavity; such and other techniques to alter the lowest resonant frequency of the cavity and enclosed structures are also within the small cavity criteria and within the scope of the invention.

Portions 50, 60 together correspond to the counter electrode 27 of FIG. 1. Alternatively, and as illustrated in FIG. 6, portions 50, 60 could correspond to an enclosing grounding cavity and counter electrode 27 could be maintained as a separate independent electrical line. In the embodiment of FIG. 2, the inside diameter of ring 54 is 0.25 inches and the height of the cavity is about 0.06 inches, although such height will vary in practice during the operation of the ACSTM. The lowest resonant frequency of cavity 70 is 98 to 100 GHz, where the cavity is air-filled. By reducing cavity dimensions, it is possible to further increase the lowest resonant frequency of the cavity. Thus, it is possible to extend measurements to even higher frequencies by further reducing the dimensions of cavity 70.

In operation, ramp 56 is grabbed either by hand or by two claw members (such as would be preferable in a vacuum) shown symbolically as arrows 72 and placed on top of assemblies 28. As explained in parent application Ser. No. 08/120,560, the bottom surface of ramp 56 has three ramps for enabling the "walking" mechanism described by Frohn et al. and Besocke referenced above, for the purpose of adjusting the distance between the sample 26 and tip 22a of the STM. By rotating ramp 56 relative to assemblies 28, it is possible to adjust the distance between sample 20 and tip 22a. In such a manner, when ramp 56 is placed on top of and supported by assemblies 28, sample 26 is at a desired initial distance from tip 22a. The dimensions of assemblies 28, ring 54, container 62, and the depth of fluid 64 are all chosen such that when ramp 56 is resting on top of assemblies 28, ring 54 is suspended in conductive fluid 64 to enclose and to seal cavity 70 electrically. The electrical enclosure is maintained during measurements of the sample since the movements of the tip 22a during the measurements would cause the fluid 64 to move only by small distances. The electrically conductive junction between ring 54 and liquid 64 permits the rotation of ramp 56 by claws 72 without otherwise affecting the instrument or the sample.

Tip 22a is in contact with a coaxial cable 76 which is attached through a ceramic spacer 78 to a scanning piezoelectric translator 80. Wires or lines 36 are connected from controllers 34 to electrodes including electrodes 81–83 deposited or fashioned on the inside and outside surfaces of the cylindrical translator 80 for applying voltages across the translator in order to control and to adjust the distance between tip 22a and sample 26 as well as to cause a scanning motion of tip 22a across the surface of sample 26 in a manner known to those skilled in the art. Typically, the adjustments of the distance between the tip and the sample as well as the distance moved in a scanning motion are typically in the range of 100 femtometers to 200 microns. During such small amplitude motions of translator 80, ring 54 will remain suspended in fluid 64 to maintain electrical enclosure of the sample and tip 22a within cavity 70.

From the above description interference to FIG. 2, it will be evident that the operation of the ACSTM involves first the alignment of the probe tip 22a with sample 26 in an initial gross adjustment to place the tip at a desired initial position adjacent to the sample so that measurements can be made using the tip. Then controllers 34 control the piezoelectric translator 80 by applying suitable voltages to electrodes such as electrodes 81–83 so as to further adjust the relative locations of the probe tip 22a and sample 26 prior to or during measurement of the sample, such as in a constant amplitude, constant current or constant height mode described above. When a beetle-style high frequency STM is used such as that illustrated in FIGS. 1 and 2, it may be necessary to rotate the beetle walker ramp 56 relative to the piezoelectric tube assemblies 28. For this purpose, the embodiment of FIG. 2 employs an electrically conductive junction which includes a ring 54 suspended in conductive fluid 64. Such junction between the ring and the fluid permits the further small distance adjustment between tip 22a and sample 26 using the piezoelectric translator 80 during detection and measurement of the sample for analysis, without causing ring 54 to disengage from the conductive fluid. In this manner, sample 26 and tip 22a remain electrically enclosed by the upper and lower housing portions 50, 60 within cavity 70 to reduce resonance effects on the output signal of the ACSTM.

The above-described beetle-style ACSTM is only one type of ACSTM construction. Other specific implementations of the STM have been proposed, without requiring the "walking" process described by Frohn et al. and Besocke referenced above. See, for example, the article "A Versatile Microwave-Frequency-Compatible Scanning Tunneling Microscope," by Stranick and Weiss, Rev. Sci. Instrum. Vol. 64, No.5, May 1993, pp. 1232–1234. In other alternative implementation of the STM, a differential screw, a piezoelectric inchworm, an electromechanical mechanism or a differential spring or a lever mechanism is used to perform the gross alignment and adjustment so as to align the probe tip 22a with the sample 26. See, for example, the article "Scanning Tunneling Microscope Instrumentation," by Kuk et al., Rev. Sci. Instrum. 60(2), February 1989. pp. 165–180. After such gross alignment, translator 80 or a piezoelectric translator similar to translator 80 of FIG. 2 is then used for fine adjustments of the distance between the tip and the sample either prior to or during the constant amplitude, constant current or constant height measurements taken using the ACST probe tip, such as in a scanning operation of the sample surface. Such alternative embodiments do not require that the electrically conductive junction connecting the two housing portions permit relative rotation between the two portions. These alternative embodiments are described below in reference to FIGS. 3–5.

FIG. 3 is a cross-sectional view of a sample, an ACSTM, a cavity totally enclosing the sample and a portion of the ACSTM, and a gasket-type electrically conductive junction, as well as a schematic view of a differential screw for performing gross distance adjustments between the sample and the probe tip. As shown in FIG. 3, the upper housing portion 102 is supported, not by piezoelectric assemblies such as in FIGS. 1 and 2, but through the lower housing portion 104 and through an electrically conductive gasket 106 by translator 80. Furthermore, instead of using a conductive fluid junction such as liquid metal type junction, the junction in FIG. 3 is formed by the connection between gasket 106 and the upper and lower portions 102, 104. In order to align tip 22a with sample 26 in the initial gross adjustment, differential screw 120 is used to move laterally and push the upper housing portion 102 towards the probe tip 22a or retract the upper portion housing away from the probe tip, thereby compressing elastic gasket 106 or allowing the gasket to expand. Screw 120 could have a permanent or breakable contact with the upper housing 102 for enabling the tip-sample approach or retraction described above. Gasket 106 has such cross-sectional dimensions that tip 22a is at a proper desired distance from sample 26 while the gasket is in contact with both the upper and lower housing portions in order to enclose and electrically seal the sample and the probe tip within cavity 110 to thereby reduce the resonance effects on the output of the ACSTM, where the dimensions of the cavity and the enclosed structures meet the small cavity criteria. The differential screw 120 may be replaced by other approach mechanisms such as a differential spring, a piezoelectric inchworm, an electromechanical mechanism or a lever mechanism; such and other variations are all within the scope of the invention.

Piezoelectric translator 80 is then again employed to adjust the distance between tip 22a and sample 26 prior to or during the measurements of the sample in a constant current or constant height mode, or for other measurements. Again, the movement of tip 22a caused by translator 80 is in the range of 100 femtometers to about 200 microns and gasket 106 is such that it retains contact with the upper and lower housing portions 102, 104 to electrically seal cavity 110 enclosing the sample and the probe tip despite such movement. A suitable gasket may, for example, be Conductive Silicon Elastomers from Instruments Specialties of Delaware Water Gap, New Jersey, or EMI Spring Gaskets from Bal Seal Engineering Co., Inc., of Santa Ana, Calif.

FIG. 4 is a schematic view of a sample, an ACSTM, a cavity enclosing the sample and a portion of the ACSTM, a leaf-spring-type electrically conductive junction forming a part of the cavity wall and a differential screw or spring. The third embodiment of FIG. 4 differs from that of FIG. 3 only in that, instead of using a gasket as in FIG. 3, a leaf spring 152 is used to connect the upper and lower housing portions 102, 154 and, together with the two housing portions, electrically enclose a cavity 150 for housing the sample and the probe tip 22a. Spring 152 may include a strip of metal formed in the shape of an O-ring having two axial ends, one end 152a in contact with the upper housing portion 102 and the other end 152b in contact with the lower housing portion 154. Again, a differential screw 120 is used to push portion 102 towards the probe tip or retract it therefrom and to adjust their relative lateral positions as well. As in the case of the gasket 106, leaf spring 152 resists any downward motion of the upper housing portion 102 caused by the screw or spring 120 and causes the sample 26 to move away from tip 22a upon the retraction of the differential screw or spring 120 away from the probe tip. Such elastic property of the spring 152 enables the spring together with the housing portions to retain electrical enclosure of the sample and the probe tip when the probe tip moves relative to the sample as caused by translator 80 when translator 80 is used to fine tune the distance between the probe tip and the sample, such fine tuning performed prior to or during the measurement of the sample. The dimensions of the cavity and the enclosed structures meet the small cavity criteria. The differential screw 120 may be replaced by other approach mechanisms such as a piezoelectric inchworm, an electromechanical mechanism, a differetial spring or a lever mechanism; such and other variations are all within the scope of the invention.

FIG. 5 is a cross-sectional view of a sample, an ACSTM, a bellows type electrically conductive junction forming part of the wall of a cavity, which together with two housing portions, electrically encloses the sample and a portion of the ACSTM and a schematic view of the differential screw or spring for adjusting the relative positions of the ACSTM portion and the sample to illustrate a fourth embodiment of the invention. The fourth embodiment of FIG. 5 differs from the third embodiment of FIG. 4 only in that an electrically conductive bellows 162 is used instead of a leaf spring 152 and a larger lower housing portion 164 is employed to accommodate the bellows type connection. Again, bellows 162, together with the upper and lower housing portions 102, 164, maintain the electrical enclosure of the sample 26 and tip 22a within cavity 160 when relative motion is caused between tip 22a and the sample 26, by screw 120 or other approach mechanisms referred to above as well as by translator 80. The dimensions of cavity 160 and the structures therein meet the small cavity criteria.

FIG. 6 is a cross-sectional view of a sample, an ACSTM, a cavity enclosing the sample and a portion of the ACSTM, and a gasket-type electrically conductive junction to illustrate a fifth embodiment of the invention. FIG. 6 also illustrates a differential screw or differential spring mechanism for gross adjustments of the distance between the sample and the portion of the ACSTM where the mechanism is attached to a sample through a rod or screw 200 passing through the upper housing portion 102' of the cavity wall into the cavity 110'. The embodiment of FIG. 6 differs from that of FIG. 3 only in that, instead of mounting the sample into the upper housing portion 102 and then connecting the differential screw 120 to upper housing portion 102 as in FIG. 3, the embodiment of FIG. 6 connects the sample to screw 120 by means of a rod or screw 200 which passes through the upper housing portion 102 so that the motion of screw or rod 200 will adjust the distance and lateral position of the sample relative to the probe tip 22a. Gasket 106 remains in contact with the upper and lower housing portions 102, 104 so that the gasket together with the two housing portions enclose the sample and the probe tip 22a electrically. Rod 200 passes through a small hole in the upper housing portion 102 where the hole is only large enough to accommodate rod 200 so as to maintain substantially complete electrical enclosure of the sample and probe tip. Instead of using two housing portions 102, 104 connected by means of a gasket 106, the gasket 106 may simply be eliminated if the sizes of the two housing portions are such that cavity 202 will have sufficient height to permit gross adjustments of the sample position relative to the probe tip using screw 120. The upper housing portion 102 may simply be resting on top of the lower housing portion 104 where the surfaces of the two housing portions in contact match so that the two housing portions substantially completely enclose the sample and the probe tip electrically. Such and other variations are all within the scope of the invention.

As described in the parent application PCT Appln No. PCT/US93/06718, it is possible to supply an AC signal of multiple components of different frequencies to the probe tip 22a which in turn applies such signal to sample 26. In such event, the above-described undesirable resonance effects will be reduced if each of the sizes of the cavities 70, 110, 115, 116, and of the structures therein meet the small cavity criteria. Such and other variations and modifications are also within the scope of the invention.

While the invention has been described above by reference to various embodiments, it will be understood that various changes, modifications and combinations may be made without departing from the scope of the invention which is defined only by the appended claims.

What is claimed is:

1. An apparatus for analyzing samples, comprising:

at least one analytical instrument applying or detecting an AC electrical signal from a sample, said signal including a signal component at a frequency; and a housing enclosing a cavity, including:(a) a first electrically conductive portion for holding the sample and (b)

a second electrically conductive portion for holding the instrument, said cavity having at least one electromagnetic resonant mode;

wherein dimensions of the cavity are such that frequency of the lowest electromagnetic resonant mode of the cavity and structures enclosed in the cavity is greater than the frequency of the signal component.

2. The apparatus of claim 1, said housing further comprising (c) an electrically conductive junction connecting the two portions so as to electrically enclose, together with the two portions, the sample and a portion of the instrument applying the signal to the sample in the cavity.

3. The apparatus of claim 2, said junction being such that distance between the two portions is adjustable while maintaining electrical enclosure of the sample and a portion of the instrument, said apparatus further comprising a device for adjusting the distance between the two portions.

4. The apparatus of claim 3, said device including a piezoelectric member for adjusting the distance between the sample and the portion of the instrument in response to a control signal.

5. The apparatus of claim 3, said device including a piezoelectric member that causes scanning motion of the portion of the instrument across the sample in response to a control signal applied to the member.

6. The apparatus of claim 2, said junction including a movable electrically conductive structure.

7. The apparatus of claim 6, said movable electrically conductive structure including an electrically conductive bellows.

8. The apparatus of claim 6, said movable electrically conductive structure including an electrically conductive spring gasket.

9. The apparatus of claim 8, said electrically conductive spring gasket including a coil spring.

10. The apparatus of claim 6, said movable electrically conductive structure including an electrically conductive metal strip in the shape of an O-ring having two axial ends, each end in contact with one of the two portions.

11. The apparatus of claim 6, said movable electrically conductive structure including an electrically conductive ring and a reservoir of conductive fluid.

12. The apparatus of claim 11, said fluid being a liquid metal.

13. The apparatus of claim 11, wherein said ring is attached to the first conductive portion and the liquid is in contact with the second conductive portion, and wherein the ring is suspended in the liquid to electrically enclose the cavity.

14. The apparatus of claim 13, further comprising a pickup device picking up the first conductive portion and raising or depositing said first conductive portion on top of and with respect to said second conductive portion, so that the ring attached to the first conductive portion is raised to above or lowered into the liquid.

15. The apparatus of claim 1, said instrument applying or detecting an AC electrical signal in the microwave frequency range.

16. The apparatus of claim 1, further comprising a sample holder attached to the first conductive portion.

17. The apparatus of claim 1, wherein the dimensions of the cavity are less than about 0.25 inches.

* * * * *